(12) United States Patent
Takata et al.

(10) Patent No.: US 11,815,549 B2
(45) Date of Patent: Nov. 14, 2023

(54) ELECTRONIC COMPONENT HANDLER, ELECTRONIC COMPONENT TESTER, AND METHOD OF DETECTING POSITION OF POCKET

(71) Applicant: SEIKO EPSON CORPORATION, Tokyo (JP)

(72) Inventors: Fuyumi Takata, Azumino (JP); Satoshi Nakamura, Matsumoto (JP)

(73) Assignee: NS Technologies, Inc., Nagano (JP)

( * ) Notice: Subject to any disclaimer, the term of this patent is extended or adjusted under 35 U.S.C. 154(b) by 151 days.

(21) Appl. No.: 17/182,259

(22) Filed: Feb. 23, 2021

(65) Prior Publication Data

US 2021/0270890 A1    Sep. 2, 2021

(30) Foreign Application Priority Data

Feb. 25, 2020   (JP) ................ 2020-029124

(51) Int. Cl.
| | | |
|---|---|---|
| G01R 31/28 | (2006.01) | |
| G01R 31/308 | (2006.01) | |
| G01R 1/02 | (2006.01) | |
| G01R 1/04 | (2006.01) | |
| G01R 1/067 | (2006.01) | |
| G01R 1/073 | (2006.01) | |

(52) U.S. Cl.
CPC ..... *G01R 31/2893* (2013.01); *G01R 31/2887* (2013.01)

(58) Field of Classification Search
CPC ...... G01R 31/02; G01R 31/28; G01R 31/308; G01R 31/31; G01R 1/02; G01R 1/04; G01R 1/0408; G01R 1/0483; G01R 1/067; G01R 1/06722; G01R 1/073; G01R 1/07314; G01B 21/956
See application file for complete search history.

(56) References Cited

U.S. PATENT DOCUMENTS

| | | | |
|---|---|---|---|
| 2007/0153249 A1* | 7/2007 | Troost ................ | G03F 7/70275 355/67 |
| 2018/0267097 A1* | 9/2018 | Matsumoto .......... | G01R 1/0433 |
| 2020/0024083 A1 | 1/2020 | Takata et al. | |

FOREIGN PATENT DOCUMENTS

| | | | | |
|---|---|---|---|---|
| CN | 1496220 | A | 5/2004 | |
| CN | 108283009 | * | 7/2018 | ............. G01N 21/89 |
| CN | 110736913 | A | 1/2020 | |
| JP | 2015190885 | A | 11/2015 | |
| WO | 2017037844 | A1 | 3/2017 | |

OTHER PUBLICATIONS

Search Report of the First Office Action CN Application No. 2021102019905 dated Dec. 5, 2022.

* cited by examiner

*Primary Examiner* — Neel D Shah
(74) *Attorney, Agent, or Firm* — Gang Yu

(57) ABSTRACT

An electronic component handler includes a tray having a pocket in which an IC device is placed, and a first device transport head that holds and transports the IC device to the pocket, wherein the first device transport head includes a light emitting portion that emits a light to the pocket, a light focusing portion that adjusts a spot diameter of the light emitted by the light emitting portion, and a light receiving portion that receives the light reflected by the pocket.

9 Claims, 11 Drawing Sheets

FIG. 11
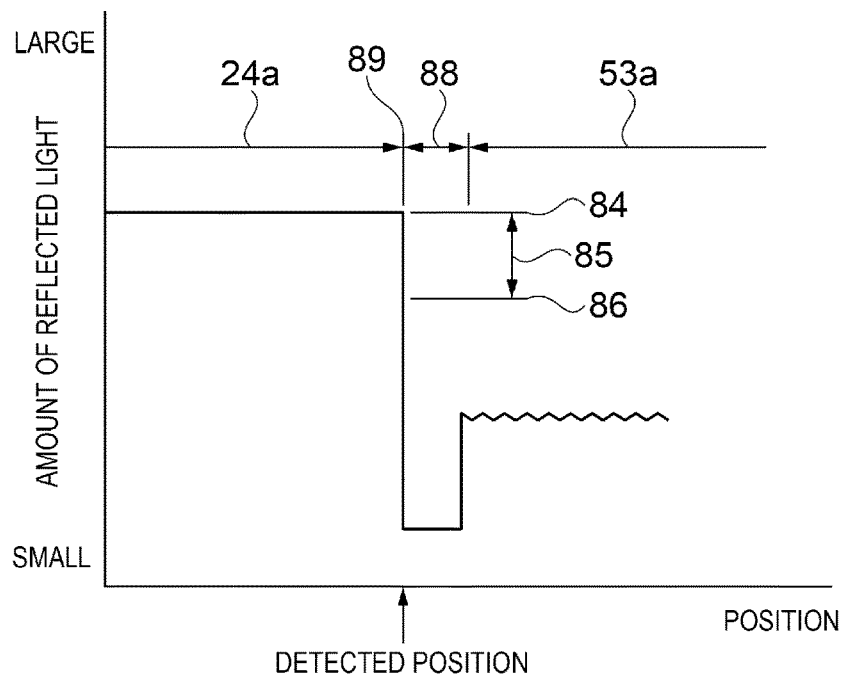
FIG. 12
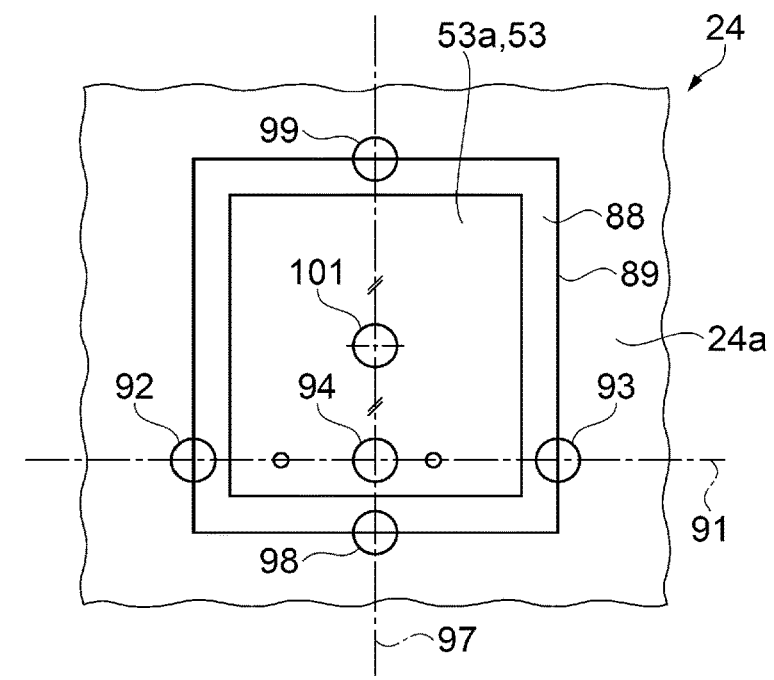
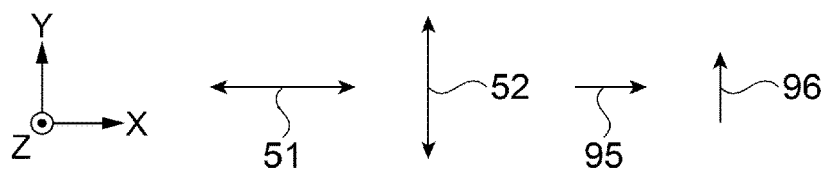

ELECTRONIC COMPONENT HANDLER, ELECTRONIC COMPONENT TESTER, AND METHOD OF DETECTING POSITION OF POCKET

The present application is based on, and claims priority from JP Application Serial Number 2020-029124, filed Feb. 25, 2020, the disclosure of which is hereby incorporated by reference herein in its entirety.

BACKGROUND

1. Technical Field

The present disclosure relates to an electronic component handler, an electronic component tester, and a method of detecting a position of a pocket.

2. Related Art

For electric characteristic tests of electronic components such as ICs (Integrated Circuits) and semiconductor devices, there are electronic component handlers that sort and store the electronic components according to test results as good items or defective items.

An electronic component handler disclosed in International Publication WO/2017/037844 includes a robot arm. The robot arm has a contact head that suctions and holds an electronic component, and a non-contact displacement meter that emits a laser beam in a direction perpendicular to a mount surface for a socket and measures a distance in the perpendicular direction.

However, in the non-contact displacement meter in International Publication WO/2017/037844, in order to measure the distance in the direction perpendicular to the mount surface for the socket, it is necessary to increase the spot diameter of the laser beam. Accordingly, it is difficult to improve resolution in the planar direction.

SUMMARY

An electronic component handler includes an electronic component mount unit having a pocket in which an electronic component is placed, and a transport section that holds and transports the electronic component to the pocket, wherein the transport section includes a light emitting portion that emits a light to the pocket, a light focusing portion that adjusts a spot diameter of the light emitted by the light emitting portion, and a light receiving portion that receives the light reflected by the pocket.

An electronic component tester includes a test unit that tests the electronic component, and the above described electronic component handler.

A method of detecting a position of a pocket is a method of detecting a position of a pocket in an electronic component handler including an electronic component mount unit having the pocket in which an electronic component is placed, including moving a location irradiated with a focused light toward the position of the pocket, detecting an amount of reflected light as an amount of light reflected by the electronic component mount unit and setting a position where the amount of reflected light changes by a predetermined value or more as a first position, and detecting the position of the pocket based on the first position.

BRIEF DESCRIPTION OF THE DRAWINGS

FIG. 11 is a diagram for explanation of the method of detecting the pocket.

FIG. 12 is a schematic plan view for explanation of the method of detecting the pocket.

DESCRIPTION OF EXEMPLARY EMBODIMENTS

First Embodiment

Figure 1:
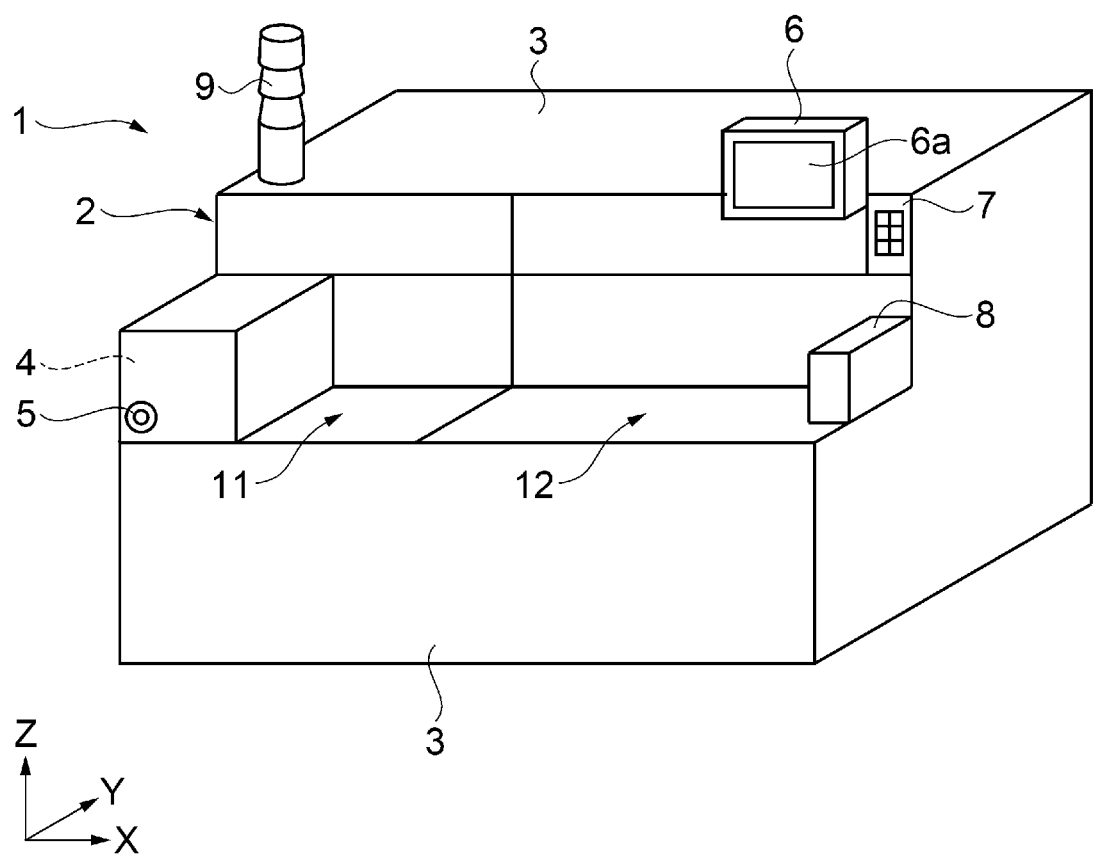
FIG. 1 is a schematic perspective view showing an electronic component tester according to a first embodiment from a front side.

As shown in FIG. 1, three axes orthogonal to one another are referred to as "X-axis", "Y-axis", and "Z-axis". Further, an X-Y plane containing the X-axis and the Y-axis is horizontal and the Z-axis is along the vertical directions. Furthermore, directions parallel to the X-axis are referred to as "X directions". Directions parallel to the Y-axis are referred to as "Y directions". Directions parallel to the Z-axis are referred to as "Z directions". The sides pointed by arrows of the respective directions are referred to as "positive" and the opposite sides are referred to as "negative".

"Horizontal" is not limited to complete horizontal, but includes slightly inclined states relative to horizontal unless transport of electronic components is hindered. "Vertical" is not limited to complete vertical, but includes slightly inclined states relative to vertical unless transport of electronic components is hindered. The inclination angles in the slightly inclined states are less than 5°.

The upside in FIG. 1, i.e., the positive side in the Z direction is referred to as "upper" or "above" and the downside, i.e., the negative side in the Z direction is referred to as "lower" or "below".

An electronic component tester 1 having an electronic component handler 2 is an apparatus that performs tests and examinations of electric characteristics of electronic components such as IC (Integrated Circuit) devices e.g. BGA (Ball Grid Array) packages. The test of electric characteristics is referred to as "electric characteristic test". As shown in FIG. 1, the electronic component tester 1 includes the electronic component handler 2 inside. The electronic component handler 2 is an apparatus that transports electronic components.

The electronic component handler 2 is covered by a cover 3. The electronic component tester 1 includes a control section 4 at the negative side in the Y direction and the negative side in the X direction. The control section 4 controls operations of the electronic component tester 1. A speaker 5 is placed near the control section 4. In the electronic component tester 1, a monitor 6, an operation panel 7, and a mouse stand 8 are placed at the negative side in the Y direction and the positive side in the X direction. Various kinds of information is displayed on a display screen 6a of the monitor 6. The monitor 6 has the display screen 6a including e.g. a liquid crystal screen and is placed in the upper part at the front side of the electronic component tester 1. The mouse stand 8 on which a mouse is mounted is provided on the right side of a tray removal region 12 in FIG. 1. An operator operates the mouse on the mouse stand 8 and the operation panel 7 to set operating conditions etc. of the electronic component tester 1 and input details of an instruction. The operation panel 7 is an interface for commanding desired operations to the electronic component tester 1.

The electronic component tester 1 includes a signal lamp 9 at the negative side in the Y direction and the negative side in the X direction. The signal lamp 9 and the speaker 5 report the operating states etc. of the electronic component tester 1. The signal lamp 9 reports the operating states etc. of the electronic component tester 1 by combinations of colors of emitted lights. The signal lamp 9 is placed in the upper part of the electronic component tester 1.

In the electronic component tester 1, a tray feed region 11 and the tray removal region 12 are provided at the negative side in the Y direction. The operator feeds trays on which electronic components are arranged to the tray feed region 11. The electronic component tester 1 takes in the tray from the tray feed region 11 and performs the electric characteristic test. The electronic component tester 1 ejects the trays on which the electronic components after the electric characteristic test are arranged to the tray removal region 12.

Figure 2:
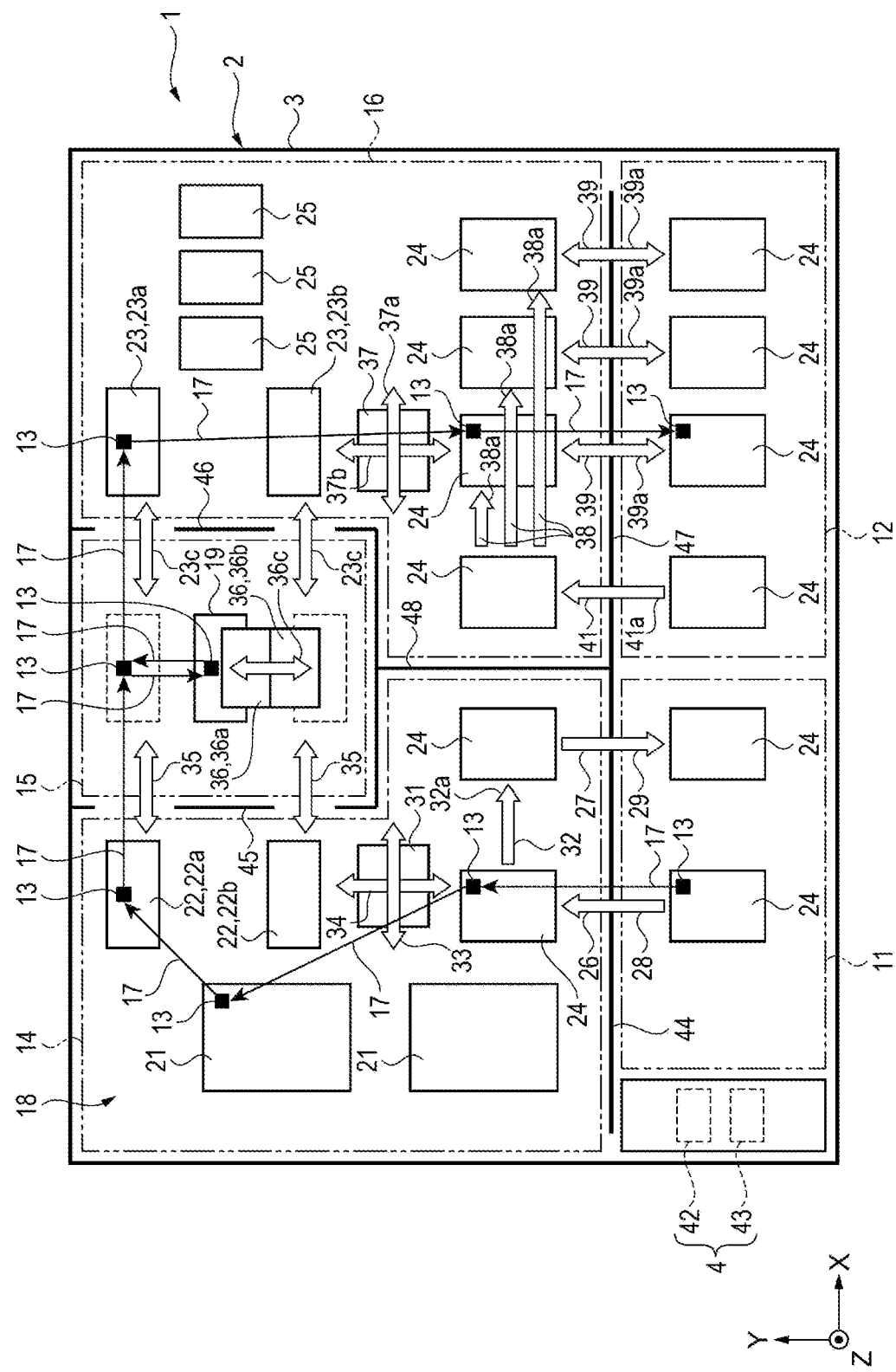
FIG. 2 is a schematic plan view showing an operating state of the electronic component tester.

As shown in FIG. 2, for convenience of explanation, a case of using IC devices 13 as electronic components will be representatively explained. The IC device 13 has a flat plate shape. A plurality of semispherical terminals are placed on a lower surface of the IC device 13.

The IC device 13 includes e.g. an LSI (Large Scale Integration), a CMOS (Complementary Metal Oxide Semiconductor), a CCD (Charge Coupled Device), a module IC in which a plurality of modules are packaged, a quartz crystal device, a pressure sensor, an inertial sensor, an acceleration sensor, a gyro sensor, and a fingerprint sensor.

The electronic component handler 2 includes the tray feed region 11, a device feed region 14, a test region 15, a device collection region 16, and the tray removal region 12. These respective regions are divided by walls. The IC device 13 sequentially passes through the respective regions in directions of first arrows 17 from the tray feed region 11 to the tray removal region 12 and a test is performed in the test region 15 along the route. The electronic component tester 1 includes the electronic component handler 2 having a transport section 18 that transports the IC device 13 through the respective regions, a test unit 19 that performs a test within the test region 15, and the control section 4 including an industrial computer.

The electronic component tester 1 is used with the side at which the tray feed region 11 and the tray removal region 12 are placed as a front side and the side at which the test region 15 is placed as a rear side.

The electronic component tester 1 is used with a unit called "change kit", which is replaced with respect to each type of the IC device 13, mounted thereon in advance. The change kit includes e.g. a temperature adjustment unit 21, a device feed unit 22, and a device collection unit 23. Other units replaced with respect to each type of the IC device 13 than the change kit include e.g. trays 24 as electronic component mount units, collection trays 25, and the test unit 19. The trays 24 are containers on which the IC devices 13 are mounted.

The tray feed region 11 is a feed part where the tray 24 on which a plurality of untested IC devices 13 are arranged is fed. On the tray feed region 11, a plurality of the trays 24 are stacked and mounted. In each tray 24, a plurality of concave portions are arranged in a matrix form. In the respective concave portions, the IC devices 13 are held one by one.

In the device feed region 14, the plurality of IC devices 13 on the tray 24 transported from the tray feed region 11 are respectively transported to the device feed unit 22. The IC devices 13 are transported from the device feed region 14 to the test region 15 by the device feed unit 22. Over the tray feed region 11 and the device feed region 14, a first tray transport mechanism 26 and a second transport mechanism 27 that transport the trays 24 in horizontal directions one by one are provided. The first tray transport mechanism 26 forms a part of the transport section 18. The first tray transport mechanism 26 moves the tray 24 with the IC devices 13 mounted thereon to the positive side in the Y direction, i.e., a direction of a second arrow 28 in FIG. 2. Thereby, the IC devices 13 are fed into the device feed region 14. Further, the second transport mechanism 27 moves the empty tray 24 to the negative side in the Y direction, i.e., a direction of a third arrow 29 in FIG. 2. The second transport mechanism 27 moves the empty tray 24 from the device feed region 14 to the tray feed region 11.

In the device feed region 14, the temperature adjustment units 21, a first device transport head 31 as a moving unit, a tray transport mechanism 32, and the device feed units 22 are provided. The temperature adjustment unit 21 is also called a soak plate (in English) or a jun wen ban (in Chinese). The device feed unit 22 moves over the device feed region 14 and the test region 15.

A plurality of IC devices 13 are mounted on the temperature adjustment unit 21. The temperature adjustment unit 21 may collectively heat or cool the mounted IC devices 13. The temperature adjustment unit 21 heats or cools the IC devices 13 in advance to adjust the devices at temperature suitable for the electric characteristic test.

In the embodiment, for example, the two temperature adjustment units 21 are placed in the Y directions. The IC devices 13 on the tray 24 transported from the tray feed region 11 by the first tray transport mechanism 26 are transported to one of the temperature adjustment units 21.

The first device transport head 31 includes a mechanism of holding the IC devices 13. The first device transport head 31 moves the IC devices 13 in the X directions, the Y directions, and the Z directions within the device feed region 14. The first device transport head 31 forms a part of the transport section 18. The first device transport head 31 transports the IC devices 13 between the tray 24 transported from the tray feed region 11 and the temperature adjustment unit 21. The first device transport head 31 transports the IC devices 13 between the temperature adjustment unit 21 and the device feed unit 22. Note that, in FIG. 2, the movement of the first device transport head 31 in the X directions is shown by a fourth arrow 33 and the movement of the first device transport head 31 in the Y directions is shown by a fifth arrow 34.

The IC devices 13 at the temperature adjusted in the temperature adjustment unit 21 are mounted on the device feed unit 22. The device feed unit 22 transports the IC devices 13 to a vicinity of the test unit 19. The device feed unit 22 is called "feed shuttle plate" or "feed shuttle". Also, the device feed units 22 form a part of the transport section 18. The device feed unit 22 has concave portions on which the IC devices 13 are held and mounted.

The device feed unit 22 reciprocates in the X directions, i.e., directions of a sixth arrow 35 between the device feed region 14 and the test region 15. Thereby, the device feed unit 22 transports the IC devices 13 from the device feed region 14 to the vicinity of the test unit 19 in the test region 15. The IC devices 13 are removed by a second device transport head 36 in the test region 15, and then, the device feed unit 22 returns to the device feed region 14 again.

The two device feed units 22 are placed in the Y directions. The device feed unit 22 at the positive side in the Y direction is referred to as "first device feed unit 22a". The device feed unit 22 at the negative side in the Y direction is referred to as "second device feed unit 22b". The IC devices 13 on the temperature adjustment unit 21 are transported to the first device feed unit 22a or the second device feed unit 22b within the device feed region 14 by the first device transport head 31. The device feed unit 22 can heat or cool the IC devices 13 mounted on the device feed unit 22. The IC devices 13 at the temperature adjusted by the temperature adjustment unit 21 are transported to the vicinity of the test unit 19 in the test region 15 at the maintained adjusted temperature. Further, the device feed units 22 and the temperature adjustment units 21 are electrically grounded to a chassis.

The tray transport mechanism 32 is a mechanism that transports the empty tray 24 after removal of all IC devices 13 to the positive side in the X direction, i.e., a direction of a seventh arrow 32a within the device feed region 14. After transport in the direction of the seventh arrow 32a, the empty tray 24 is returned from the device feed region 14 to the tray feed region 11 by the second transport mechanism 27.

The test region 15 is a region in which the IC devices 13 are tested. In the test region 15, the test unit 19 that tests the IC devices 13 and the second device transport heads 36 are provided.

The second device transport heads 36 form a part of the transport section 18 and can heat or cool the held IC devices 13. The second device transport head 36 transports the IC devices 13 at the adjusted temperature maintained within the test region 15.

The second device transport heads 36 are supported reciprocably in the Y directions and the Z directions within the test region 15, and form a part of a mechanism called "index arm". The second device transport head 36 lifts the IC devices 13 and transports and mounts the devices onto the test unit 19 from the device feed unit 22.

In FIG. 2, the reciprocation of the second device transport heads 36 in the Y directions is shown by an eighth arrow 36c. The second device transport heads 36 serve to transport the IC devices 13 from the first device feed unit 22a to the test unit 19 and transport the IC devices 13 from the second device feed unit 22b to the test unit 19. Further, the second device transport heads 36 are supported reciprocably in the Y directions.

The two second device transport heads 36 are placed in the Y directions. The second device transport head 36 at the positive side in the Y direction is referred to as "third device transport head 36a". The second device transport head 36 at the negative side in the Y direction is referred to as "fourth device transport head 36b". The third device transport head 36a serves to transport the IC devices 13 from the first device feed unit 22a to the test unit 19. The fourth device transport head 36b serves to transport the IC devices 13 from the second device feed unit 22b to the test unit 19. The third device transport head 36a serves to transport the IC devices 13 from the test unit 19 to a first device collection unit 23a. The fourth device transport head 36b serves to transport the IC devices 13 from the test unit 19 to a second device collection unit 23b.

The IC device 13 is mounted on the test unit 19 and the test unit 19 tests electric characteristics of the IC device 13. In the test unit 19, a plurality of probe pins to be electrically coupled to the terminals of the IC device 13 are provided. The terminals of the IC device 13 and the probe pins are electrically coupled. Then, the test unit 19 performs a test of the IC device 13. The test of the IC device 13 is performed based on a program stored in a test control unit provided in a tester electrically coupled to the test unit 19. Also, in the test unit 19, the IC device 13 may be heated or cooled and the IC device 13 may be adjusted at a temperature suitable for the test.

The device collection region 16 is a region in which the plurality of IC devices 13 after test are collected. In the device collection region 16, the collection trays 25, a fifth device transport head 37, and third tray transport mechanisms 38 are provided. The device collection units 23 moving over the test region 15 and the device collection region 16 are further provided. The empty trays 24 are prepared in the device collection region 16.

On the device collection unit 23, the IC devices 13 after test are placed. The device collection unit 23 transports the IC devices 13 to the device collection region 16. The device collection unit 23 is also referred to as "collection shuttle plate" or simply "collection shuttle". Also, the device collection units 23 form a part of the transport section 18.

The device collection units 23 are supported reciprocably in the X directions, i.e., along directions of ninth arrows 23c between the test region 15 and the device collection region 16. The two device collection units 23 are placed in the Y directions. The device collection unit 23 at the positive side in the Y direction is the first device collection unit 23a. The device collection unit 23 at the negative side in the Y direction is the second device collection unit 23b. The IC devices 13 on the test unit 19 are transported and mounted onto the first device collection unit 23a and the second device collection unit 23b. The second device transport heads 36 serve to transport the IC devices 13 from the test unit 19 to the first device collection unit 23a and transport the IC devices 13 from the test unit 19 to the second device collection unit 23b. Further, the device collection units 23 are electrically grounded to the chassis.

On the collection trays 25, the IC devices 13 tested in the test unit 19 are placed. The IC devices 13 are fixed to the collection trays 25 not to move within the device collection region 16. Even in the device collection region 16 where a relatively large number of various movable units including the fifth device transport head 37 are placed, the tested IC devices 13 are stably mounted on the collection trays 25. Three collection trays 25 are placed along the X directions.

Further, the four empty trays 24 are placed along the X directions. The tested IC devices 13 are mounted on the empty trays 24. The IC devices 13 on the device collection unit 23 are transported and mounted onto one of the collection trays 25 or the empty trays 24. The IC devices 13 are sorted and collected with respect to each test result.

The fifth device transport head 37 is supported reciprocably in the X directions and the Y directions within the device collection region 16. The fifth device transport head 37 has a portion also movable in the Z directions. The fifth device transport head 37 forms a part of the transport section 18. The fifth device transport head 37 transports the IC devices 13 from the device collection unit 23 to the collection tray 25 or the empty tray 24. In FIG. 2, the movement of the fifth device transport head 37 in the X directions is shown by a tenth arrow 37*a* and the movement of the fifth device transport head 37 in the Y directions is shown by an eleventh arrow 37*b*.

The third tray transport mechanism 38 is a mechanism of transporting the empty tray 24 transported from the tray removal region 12 in the X directions, i.e., directions of twelfth arrows 38*a* within the device collection region 16. After the transport, the empty tray 24 is placed in a position where the IC devices 13 are collected.

In the tray removal region 12, the tray 24 on which the plurality of tested IC devices 13 are arranged is collected and removed. In the tray removal region 12, the many trays 24 are stacked.

Fourth tray transport mechanisms 39 and a fifth tray transport mechanism 41 that transport the trays 24 in the Y directions one by one over the device collection region 16 and the tray removal region 12 are provided. The fourth tray transport mechanisms 39 form a part of the transport section 18 and reciprocate the trays 24 in the Y directions, i.e., directions of thirteenth arrows 39*a*. The fourth tray transport mechanism 39 transports the tested IC devices 13 from the device collection region 16 to the tray removal region 12. The fifth tray transport mechanism 41 moves the empty tray 24 for collection of the IC devices 13 to the positive side in the Y direction, i.e., a direction of a fourteenth arrow 41*a*. The fifth tray transport mechanism 41 moves the empty tray 24 from the tray removal region 12 to the device collection region 16.

The control section 4 controls operations of the respective units of the first tray transport mechanism 26, the second transport mechanism 27, the temperature adjustment units 21, the first device transport head 31, the device feed units 22, the tray transport mechanism 32, the test unit 19, the second device transport heads 36, the device collection units 23, the fifth device transport head 37, the third tray transport mechanisms 38, the fourth tray transport mechanisms 39, and the fifth tray transport mechanism 41. The control section 4 has a CPU 42 (Central Processing Unit) and a memory 43. The CPU 42 reads various kinds of information including determination programs and instruction and command programs stored in the memory 43 and executes determinations and commands.

The control section 4 may be provided inside of the electronic component tester 1 or the electronic component handler 2 or provided in an external device such as an external computer. For example, the external device may communicate with the electronic component tester 1 via a cable or the like, wirelessly communicate with the tester, or communicate with the electronic component tester 1 via a network.

In the electronic component tester 1, the tray feed region 11 and the device feed region 14 are divided by a first partition wall 44. The device feed region 14 and the test region 15 are divided by a second partition wall 45. The test region 15 and the device collection region 16 are divided by a third partition wall 46. The device collection region 16 and the tray removal region 12 are divided by a fourth partition wall 47. The device feed region 14 and the device collection region 16 are divided by a fifth partition wall 48.

Figure 3:
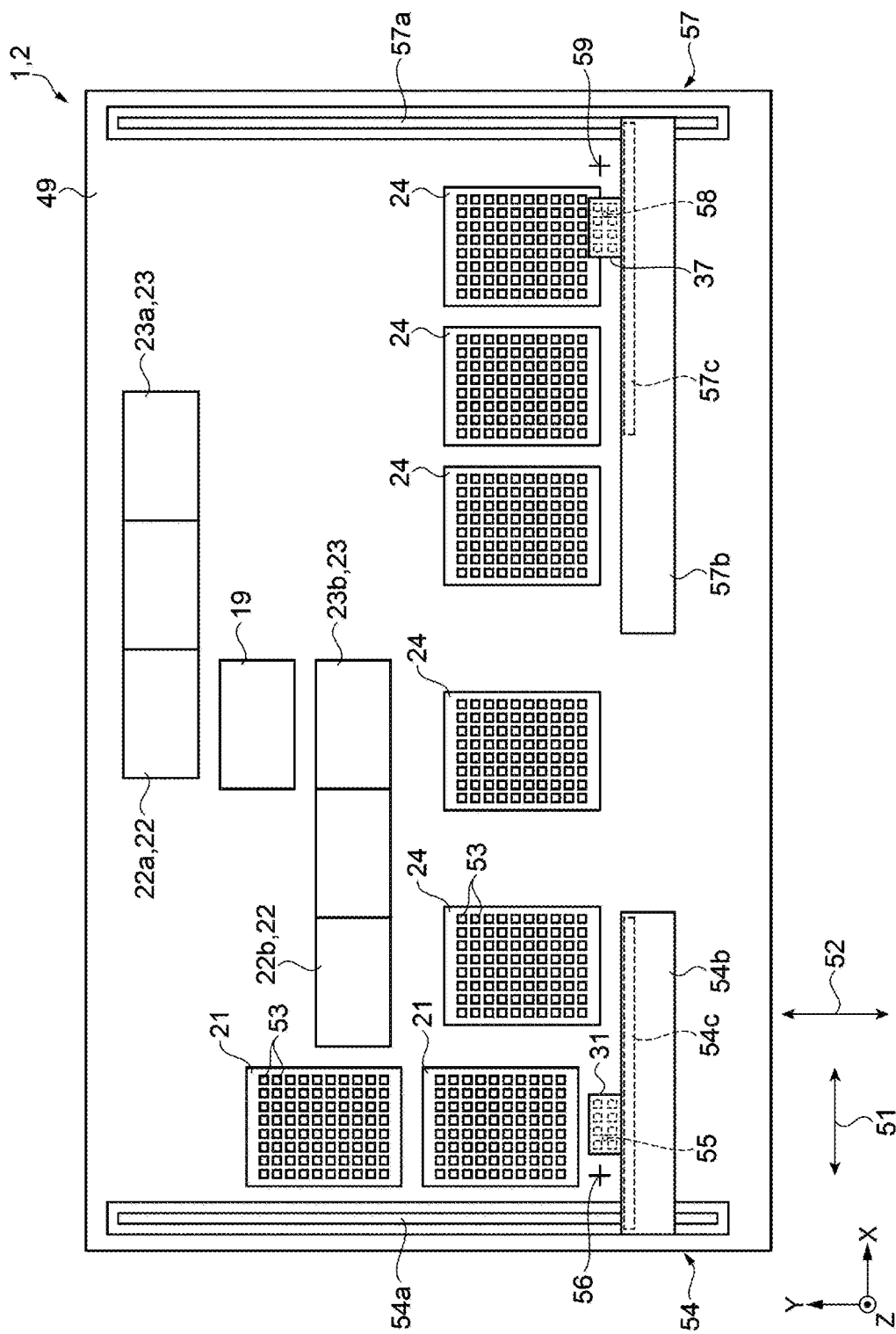
FIG. 3 is a schematic plan view showing an installation of robots.

As shown in FIG. 3, the electronic component tester 1 includes a container mount member 49 on which the trays 24 are mounted. An axis parallel to the X-axis is referred to as "first axis 51". An axis orthogonal to the first axis 51 is referred to as "second axis 52". The second axis 52 is parallel to the Y-axis.

The tray 24 has pockets 53 on which the IC devices 13 are placed. The planar shape of the pocket 53 is substantially the same as that of the IC device 13. The pocket 53 is recessed toward the negative side in the Z direction and the IC device 13 placed in the pocket 53 is positioned by the tray 24.

A first transport robot 54 moving the first device transport head 31 is placed at the negative side in the X direction of the container mount member 49. The first transport robot 54 includes a first rail 54*a* extending in the Y directions. A first arm 54*b* is placed on the first rail 54*a*. The first arm 54*b* moves along the first rail 54*a*.

The first arm 54*b* includes a second rail 54*c* extending in first axis 51 directions. The first device transport head 31 is placed on the first arm 54*b*. The first device transport head 31 moves along the second rail 54*c*. The first transport robot 54 includes two motors, pulleys fixed to the shafts of the respective motors, and belts looped over the respective pulleys (not shown). The respective belts are fixed to the first arm 54*b* and the first device transport head 31. The first transport robot 54 drives the respective motors to move the first device transport head 31 in the X directions and the Y directions. As described above, the first transport robot 54 has the first device transport head 31 that holds and transports the IC device 13 to the pocket 53.

The first device transport head 31 includes a first sensor 55 that detects positions of the pocket 53 in the X directions and the Y directions. The first sensor 55 outputs a focused light. When energized, the first transport robot 54 moves the first device transport head 31 to a home position. In this regard, a location facing the first sensor 55 is set as a first sensor origin 56.

A second transport robot 57 moving the fifth device transport head 37 is placed at the positive side in the X direction of the container mount member 49. The second transport robot 57 includes a third rail 57*a* extending in the Y directions. A second arm 57*b* is placed on the third rail 57*a*. The second arm 57*b* moves along the third rail 57*a*.

The second arm 57*b* includes a fourth rail 57*c* extending in the first axis 51 directions. The fifth device transport head 37 is placed on the second arm 57*b*. The fifth device transport head 37 moves along the fourth rail 57*c*. The second transport robot 57 includes two motors, pulleys fixed to the shafts of the respective motors, and belts looped over the respective pulleys (not shown). The respective belts are fixed to the second arm 57*b* and the fifth device transport head 37. The second transport robot 57 drives the respective motors to move the fifth device transport head 37 in the X directions and the Y directions. As described above, the second transport robot 57 has the fifth device transport head 37 that holds the IC device 13 and moves along the third rail 57*a* and the fourth rail 57*c*.

The fifth device transport head 37 includes a second sensor 58 that detects the positions of the pocket 53 in the X directions and the Y directions. When energized, the second transport robot 57 moves the fifth device transport head 37 to a home position. In this regard, a location facing the second sensor 58 is set as a second sensor origin 59.

Figure 4:
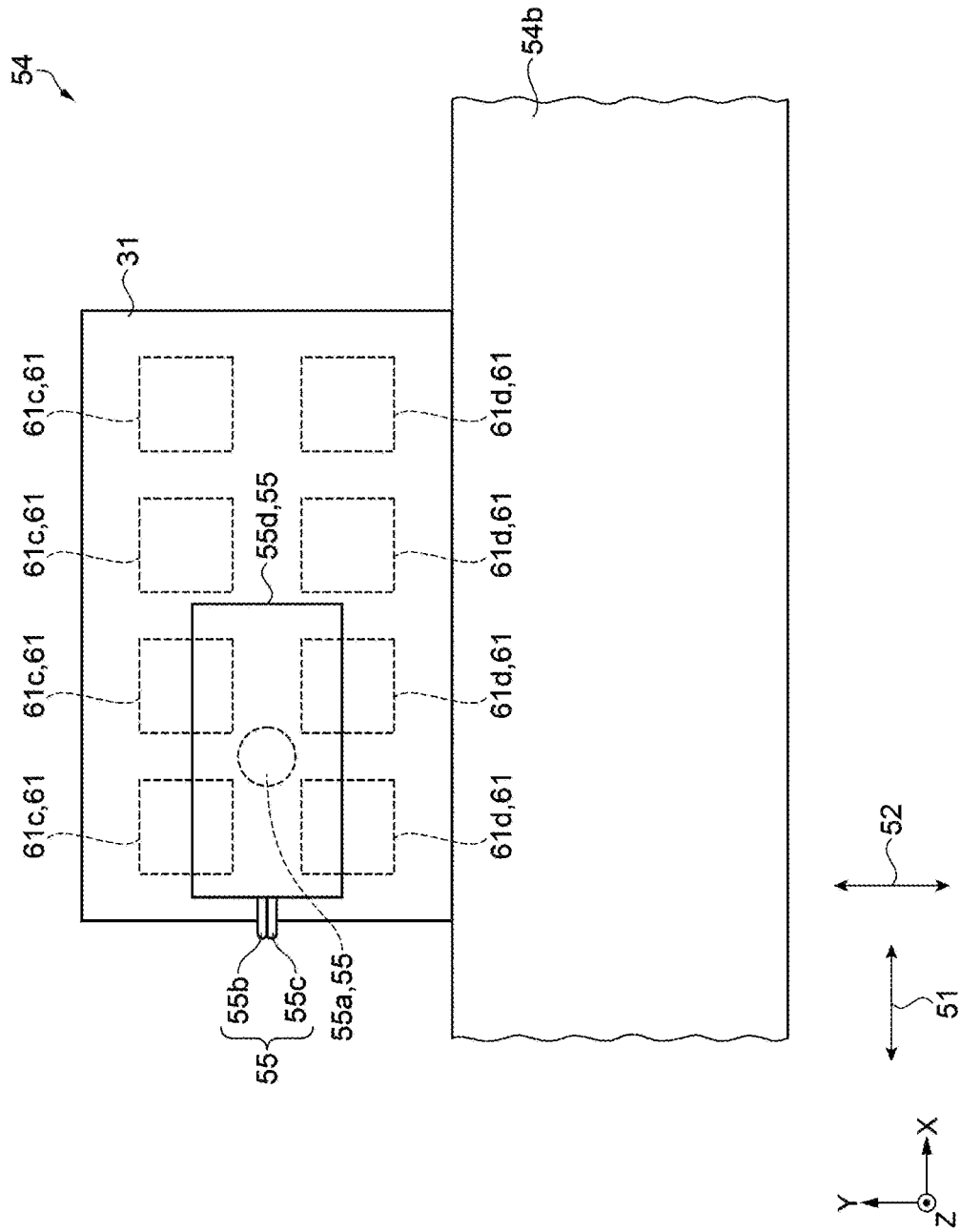
FIG. 4 is a schematic plan view showing a configuration of a first device transport head.
Figure 5:
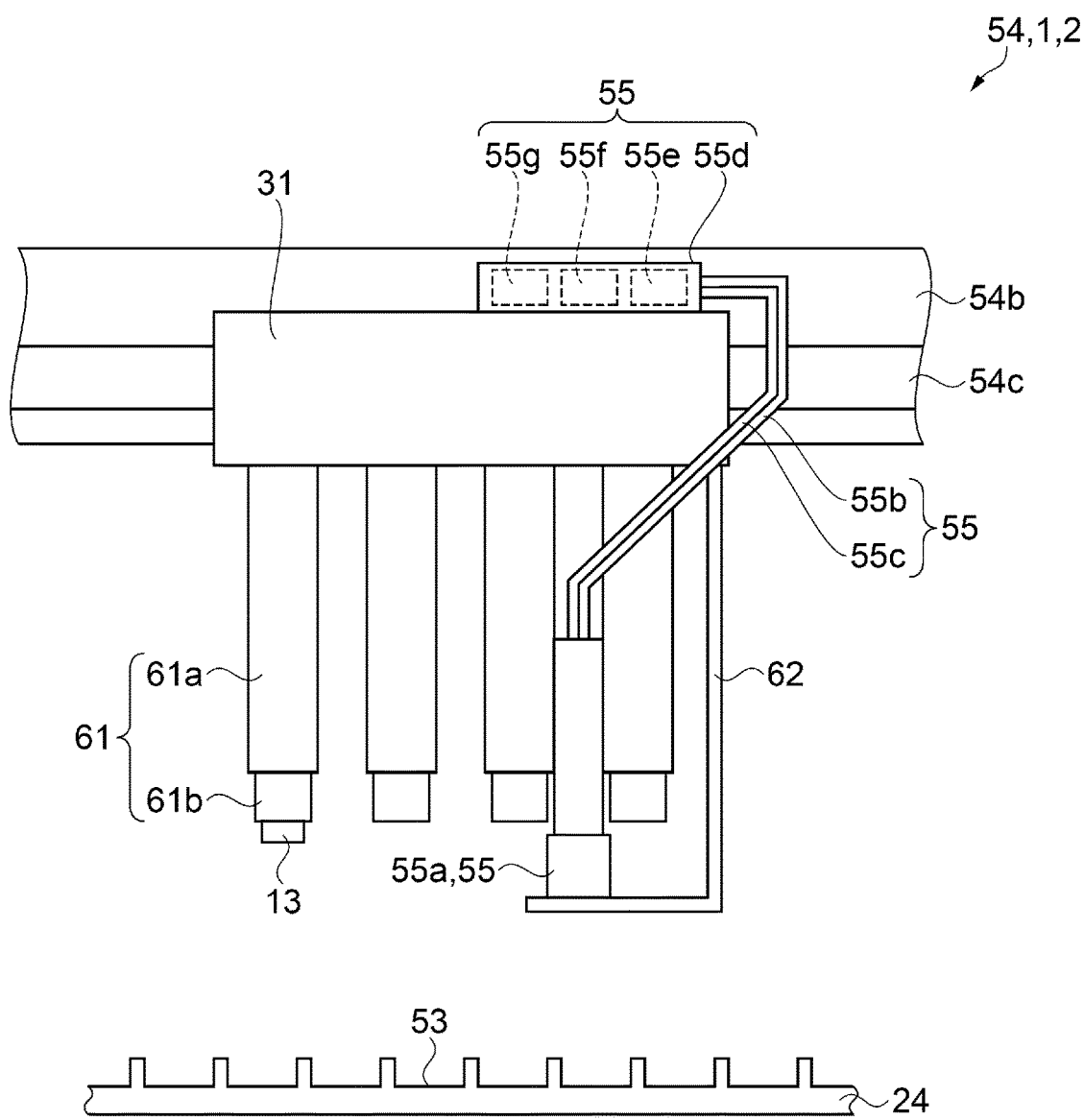
FIG. 5 is a schematic side view showing the configuration of the first device transport head.

As shown in FIGS. 4 and 5, the first device transport head 31 includes holding hands 61 that hold the IC devices 13. The holding hands 61 are arranged in two rows and four columns. The holding hands 61 in the row at the positive side in the Y direction are referred to as "first holding hands 61*c*" as first holding units. The holding hands 61 in the row at the negative side in the Y direction are referred to as "second holding hands 61d" as second holding units. The first device transport head 31 includes the first holding hands 61c and the second holding hands 61d that detachably hold the IC devices 13. The holding hand 61 includes an elevating portion 61a and a suction portion 61b. The elevating portion 61a includes a linear motion mechanism and moves upward and downward the suction portion 61b in the Z directions. The suction portion 61b is coupled to a decompression pump by a pipe and suctions and holds the IC device 13. Then, the suction portion 61b releases the suctioned IC device 13.

The first sensor 55 includes a light focusing portion 55a, a lighting fiber 55b, a receiving fiber 55c, and a sensor controller 55d. The sensor controller 55d includes an LED 55e (light emitting diode), a phototransistor 55f, and a sensor drive unit 55g. The sensor drive unit 55g includes a circuit that drives the LED 55e and the phototransistor 55f.

The light focusing portion 55a is placed between the first holding hands 61c and the second holding hands 61d. The light focusing portion 55a is fixed to the first device transport head 31 by a supporting member 62 as a light focusing portion supporting part. The pockets 53 of the tray 24 are placed at the negative side in the Z direction of the light focusing portion 55a. The light focusing portion 55a is supported at an end at the pockets 53 side by the supporting member 62.

The light emitted by the LED 55e passes through the lighting fiber 55b and the light focusing portion 55a and radiates the pocket 53. The light reflected by the pocket 53 passes through the receiving fiber 55c and radiates the phototransistor 55f. An amount of light received by the phototransistor 55f is converted into an analog electrical signal and output to the sensor drive unit 55g. The sensor drive unit 55g converts the analog electrical signal into a digital electrical signal and outputs the signal to the CPU 42.

Figure 6:
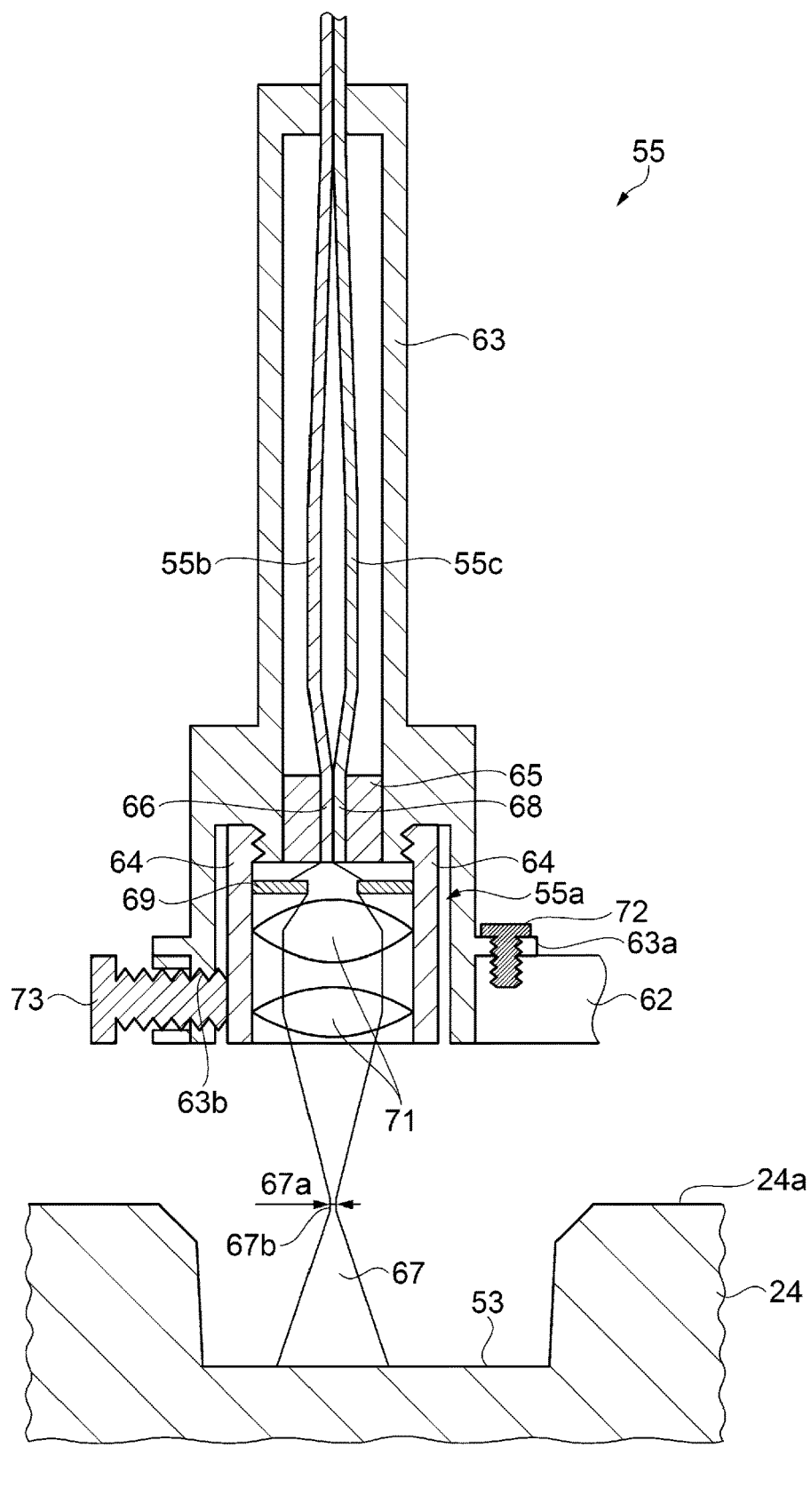
FIG. 6 is a schematic sectional side view showing a configuration of a first sensor.

As shown in FIG. 6, the first sensor 55 includes a first case 63 and a second case 64 as cases. The first case 63 and the second case 64 have cylindrical shapes. The lighting fiber 55b and the receiving fiber 55c are inserted into the first case 63 and fixed by a fixing member 65. An end at the pocket 53 side of the lighting fiber 55b is referred to as "light emitting portion 66". The light emitting portion 66 emits a light 67 to the pocket 53. An end at the pocket 53 side of the receiving fiber 55c is referred to as "light receiving portion 68". The light 67 reflected by the pocket 53 is received by the light receiving portion 68.

The first case 63 has a larger inner diameter at the pocket 53 side. In this location, the light focusing portion 55a is placed. The light focusing portion 55a is placed between the light emitting portion 66 and the pocket 53. The light focusing portion 55a includes a diaphragm portion 69 and focusing lenses 71 in the second case 64. The diaphragm portion 69 passes a part close to the optical axis of the light 67 spreading from the light emitting portion 66. The light 67 passing through the diaphragm portion 69 is focused by the focusing lenses 71. A location where the light 67 is focused by the light focusing portion 55a is referred to as "focus point 67b". The diameter of the focus point 67b is referred to as "spot diameter 67a". When the diameter of the part through which the diaphragm portion 69 passes the light 67 is smaller, the spot diameter 67a is smaller. The light focusing portion 55a adjusts the spot diameter 67a of the light 67 emitted by the light emitting portion 66. As described above, the first device transport head 31 includes the light emitting portion 66, the light receiving portion 68, and the light focusing portion 55a.

Inside of the first case 63, a male thread is formed. Inside of the second case 64, a female thread is formed. The male thread of the first case 63 and the female thread of the second case 64 are screwed together. The second case 64 is rotated relative to the first case 63, and thereby, the first case 63 and the second case 64 are separably coupled. Therefore, the light focusing portion 55a is separable from the light emitting portion 66 and the light receiving portion 68. Several types of the light focusing portions 55a formed by combinations of the diaphragm portions 69 having different diaphragm diameters and the focusing lenses 71 having different focal lengths are prepared. The operator may adjust the size of the spot diameter 67a by changing the light focusing portion 55a.

The light focusing portion 55a is replaced so that the distance between the light focusing portion 55a and the focus point 67b may be unchanged. In this regard, the light focusing portion 55a may be replaced so that the focus point 67b may be located on an upper surface 24a of the tray 24. Further, a step of adjusting the distance between the light focusing portion 55a and the focus point 67b may be deleted.

The first case 63 includes a rib 63a on the outer circumference at the pocket 53 side. The rib 63a and the supporting member 62 are fastened by a first screw 72. The first case 63 includes a through hole 63b in a radial direction near an end at the pocket 53 side. A female thread is formed in the through hole 63b. A second screw 73 is inserted into the through hole 63b, and the second screw 73 and the female thread of the through hole 63b are screwed together. When the operator turns the second screw 73, the second screw 73 presses the second case 64. The second case 64 is harder to rotate relative to the first case 63, and thereby, the light focusing portion 55a is harder to be detached from the first case 63. As described above, the second screw 73 suppresses detachment of the light focusing portion 55a from the first case 63.

The light emitting portion 66, the light focusing portion 55a, and the light receiving portion 68 are housed in the first case 63. The light emitting portion 66, the light focusing portion 55a, and the light receiving portion 68 may be collectively placed in the first device transport head 31. Therefore, the light emitting portion 66, the light focusing portion 55a, and the light receiving portion 68 may be placed in a smaller space. Note that the first sensor 55 and the second sensor 58 have the same structure.

Figure 7:
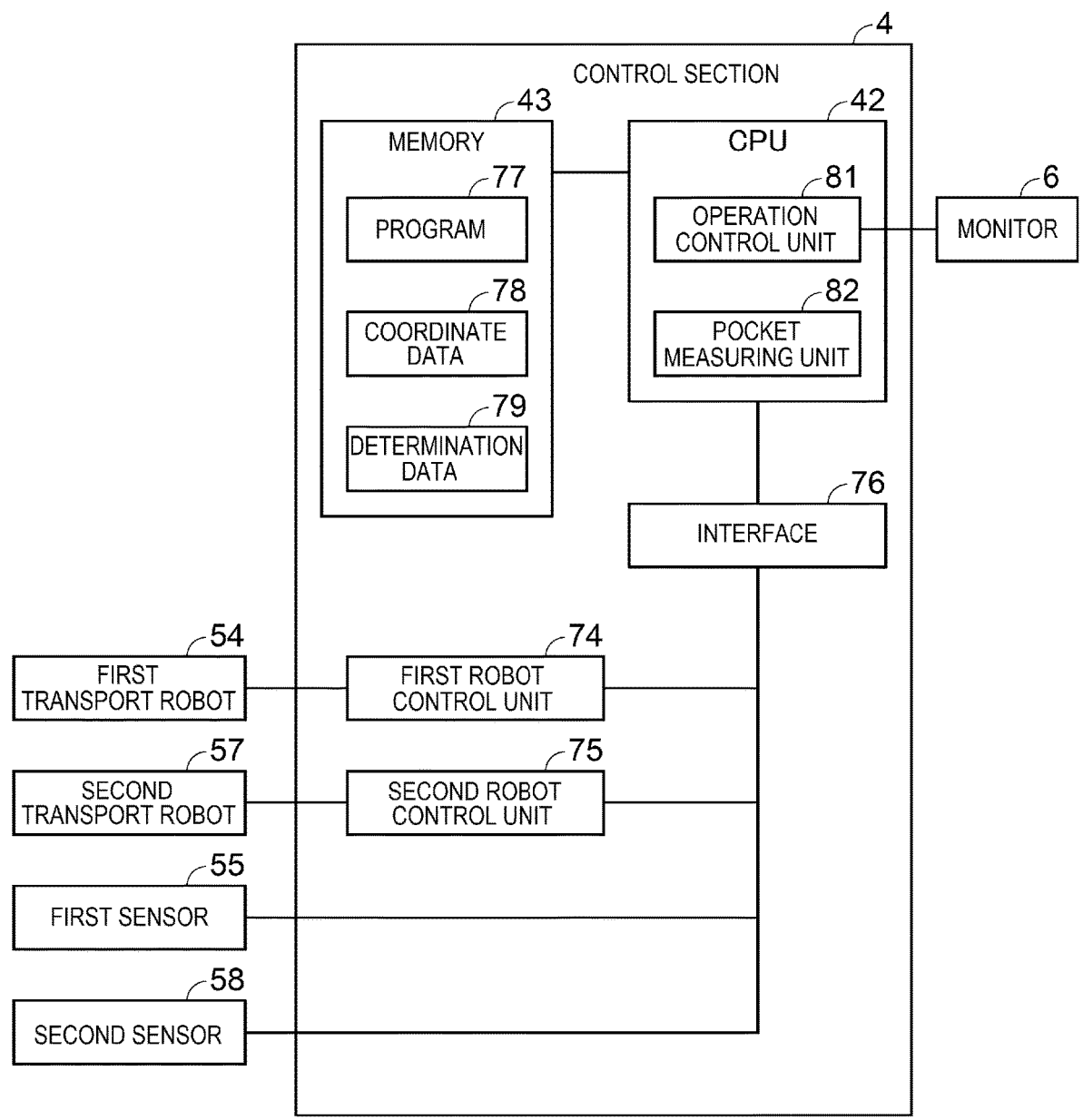
FIG. 7 is an electric block diagram showing a configuration of a control section.

As shown in FIG. 7, the control section 4 includes the CPU 42 that performs various kinds of calculation processing as a processor and the memory 43 that stores various kinds of information. A first robot control unit 74, a second robot control unit 75, the first sensor 55, and the second sensor 58 are electrically coupled to the CPU 42 via an interface 76.

The first robot control unit 74 controls the operation of the first transport robot 54. The first robot control unit 74 moves the first device transport head 31 to a location instructed according to an instruction signal input from the CPU 42.

The second robot control unit 75 controls the operation of the second transport robot 57. The second robot control unit 75 moves the fifth device transport head 37 to a location instructed according to an instruction signal input from the CPU 42.

The memory 43 includes a semiconductor memory such as a RAM or ROM and an external memory device such as a hard disc. The memory 43 stores a program 77 in which control procedures of the operation of the electronic component handler 2, determination procedures of defective transport, etc. are described. Further, the memory 43 stores coordinate data 78 output by the first sensor 55 and the second sensor 58. Furthermore, the memory 43 stores determination data 79 including a determination value for determination of data.

The CPU 42 controls the operation of the electronic component handler 2 according to the program 77 stored within the memory 43. The CPU 42 has various functional units for realizing functions. As a specific functional unit, the CPU 42 has an operation control unit 81. The operation control unit 81 provides instructions on movement destinations and movement times of the first device transport head 31 and the fifth device transport head 37.

Further, the CPU 42 has a pocket measuring unit 82. The pocket measuring unit 82 calculates a position of the pocket 53.

Next, a pocket position detection method of detecting a position of the pocket 53 by the first sensor 55 will be explained. A method of detecting the position of the pocket 53 by the second sensor 58 is the same as the method by the first sensor 55 for condition check. The method of detecting the position of the pocket 53 by the first sensor 55 will be explained and the method of detecting the position of the pocket 53 by the second sensor 58 will be omitted.

Figure 8:
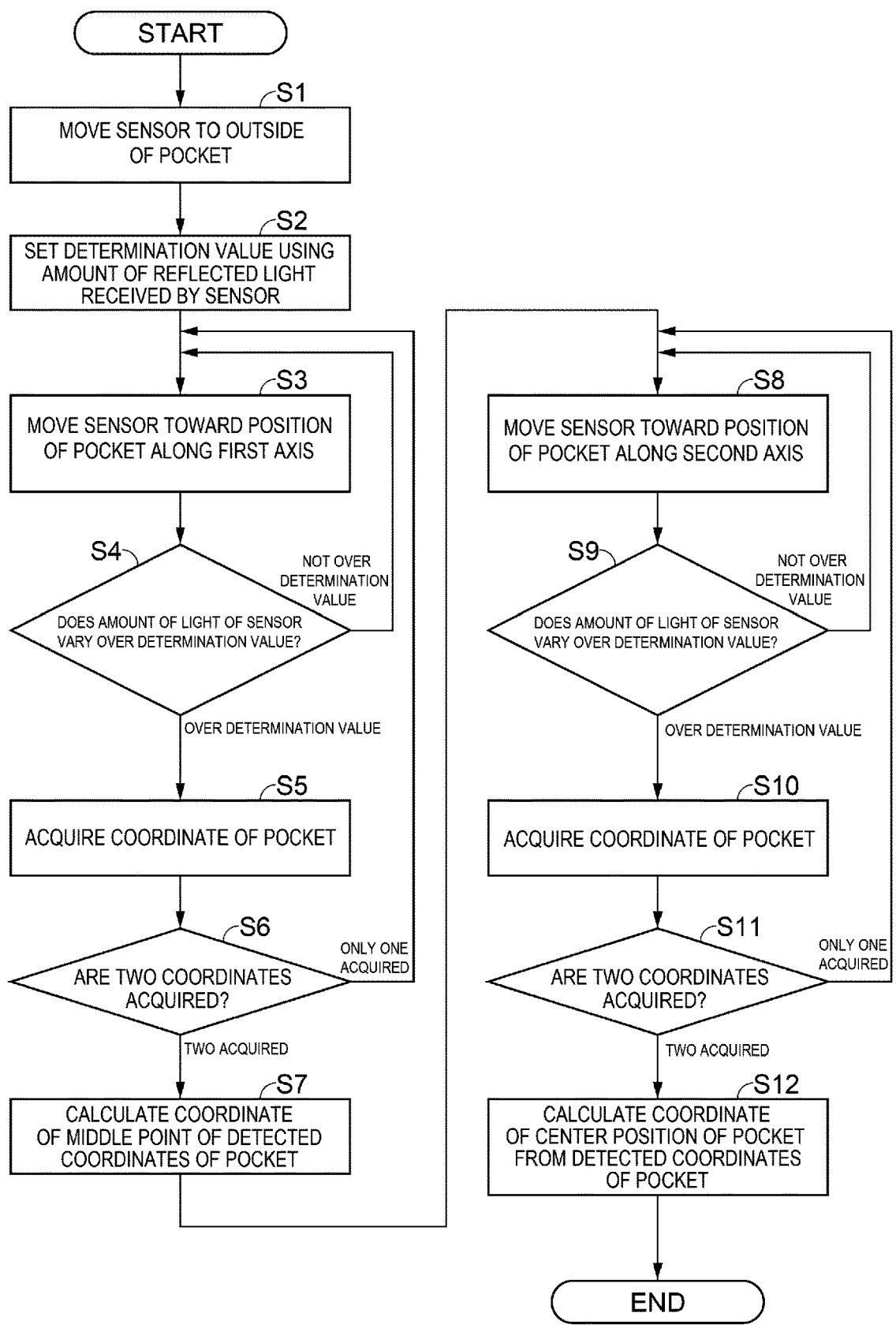
FIG. 8 is a flowchart of a method of detecting a pocket.

In FIG. 8, step S1 is a step of moving the sensor to the outside of the pocket. At this step, the first robot control unit 74 moves the first sensor 55. A location irradiated with the focused light 67 moves toward a position near the pocket 53. Then, the process moves to step S2.

Step S2 is a step of setting the determination value using the amount of reflected light by the sensor. At this step, the first sensor 55 irradiates the upper surface 24a of the tray 24 with the light 67. The pocket measuring unit 82 sets the determination value used for detection of the position of the pocket 53 using the amount of reflected light reflected by the upper surface 24a of the tray 24.

Step S3 is a step of moving the sensor toward the position of the pocket along the first axis. At this step, the first robot control unit 74 moves the first sensor 55 along the first axis 51. The operation control unit 81 moves a location irradiated with the focused light 67 toward the position of the pocket 53. Then, the process moves to step S4.

Step S4 is a step of determining whether or not the amount of light of the sensor varies over the determination value. At this step, the pocket measuring unit 82 compares the amount of reflected light with the determination value. When the amount of reflected light does not exceed the determination value, the process moves to step S3. When the amount of reflected light exceeds the determination value, the process moves to step S5.

Step S5 is a step of acquiring a coordinate of the pocket. At this step, the pocket measuring unit 82 acquires the coordinate of the location where the amount of reflected light exceeds the determination value. The pocket measuring unit 82 stores the coordinate data 78 of the coordinate in the memory 43. Then, the process moves to step S6. The coordinates of the pocket at steps S5, S6, S10, S11 show coordinates of certain points on sides of the square pocket.

Step S6 is a step of determining whether or not two coordinates are acquired. When only one coordinate on the first axis 51 is acquired, the process moves to step S3. When the two coordinates on the first axis 51 are acquired, the process moves to step S7.

Step S7 is a step of calculating a coordinate of a middle point of the pocket from the detected coordinates of the pocket. At this step, the pocket measuring unit 82 calculates the middle point of the two coordinates of the pocket on the first axis. Then, the process moves to step S8.

Step S8 is a step of moving the sensor toward the position of the pocket along the second axis. At this step, the first robot control unit 74 moves the first sensor 55 along the second axis 52. The operation control unit 81 moves the location irradiated with the focused light 67 toward the position of the pocket 53. Then, the process moves to step S9.

Step S9 is a step of determining whether or not the amount of light of the sensor varies over the determination value. At this step, the pocket measuring unit 82 compares the amount of reflected light with the determination value. When the amount of reflected light does not exceed the determination value, the process moves to step S8. When the amount of reflected light exceeds the determination value, the process moves to step S10.

Step S10 is a step of acquiring a coordinate of the pocket. At this step, the pocket measuring unit 82 acquires the coordinate of the location where the amount of reflected light exceeds the determination value. The pocket measuring unit 82 stores the coordinate data 78 of the coordinate in the memory 43. Then, the process moves to step S11.

Step S11 is a step of determining whether or not two coordinates are acquired. When only one coordinate on the second axis 52 is acquired, the process moves to step S8. When the two coordinates on the second axis 52 are acquired, the process moves to step S12.

Step S12 is a step of calculating a coordinate of a middle position of the pocket from the detected coordinates of the pocket. At this step, the pocket measuring unit 82 calculates the middle point of the two coordinates of the pocket on the second axis 52. The coordinate of the middle point is used as the center position of the pocket 53. At the above described step, the process of detecting the position of the pocket 53 is ended.

Figure 9:
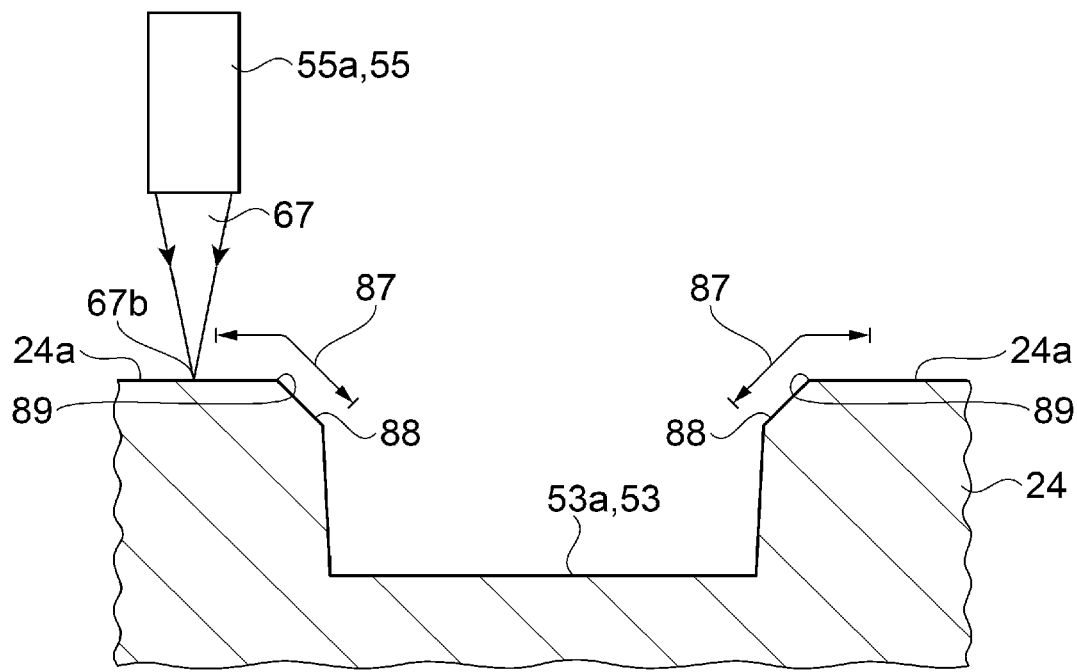
FIG. 9 is a schematic sectional side view for explanation of the method of detecting the pocket.

Next, using FIGS. 9 to 12, the method of detecting the position of the pocket 53 will be explained in detail in correspondence with the steps shown in FIG. 8. FIGS. 9 and 11 correspond to step S2. As shown in FIG. 9, the operation control unit 81 moves the light focusing portion 55a so that the focus point 67b may be located on the upper surface 24a as a first surface of the tray 24.

In FIG. 11, the horizontal axis indicates the position where the focus point 67b moves. The vertical axis indicates the amount of reflected light received by the phototransistor 55f. When the light 67 radiates the upper surface 24a, the amount of reflected light is larger. The amount of the light 67 reflected by the upper surface 24a and received by the phototransistor 55f is referred to as "upper surface amount of light 84". An amount of light lower than the upper surface amount of light 84 by a determination value 85 is referred to as "determination value 86".

FIGS. 9 to 12 correspond to step S3 to step S6. As shown in FIG. 9, the tray 24 has a marker portion 87 around the pocket 53. The marker portion 87 is a combination of the upper surface 24a orthogonal to the optical axis of the light 67 output from the light focusing portion 55a and an inclined surface 88 as a second surface inclined relative to the upper surface 24a. A line at the boundary between the upper surface 24a and the inclined surface 88 is referred to as "mark line 89". The mark line 89 surrounds the pocket 53. The inclined surface 88 is placed around the pocket 53 with a fixed width, and the planar shape of the pocket 53 and the planar shape of the mark line 89 are similar figures. The center of the pocket 53 and the center of the mark line 89 having the square planar shapes are at the same point.

Figure 10:
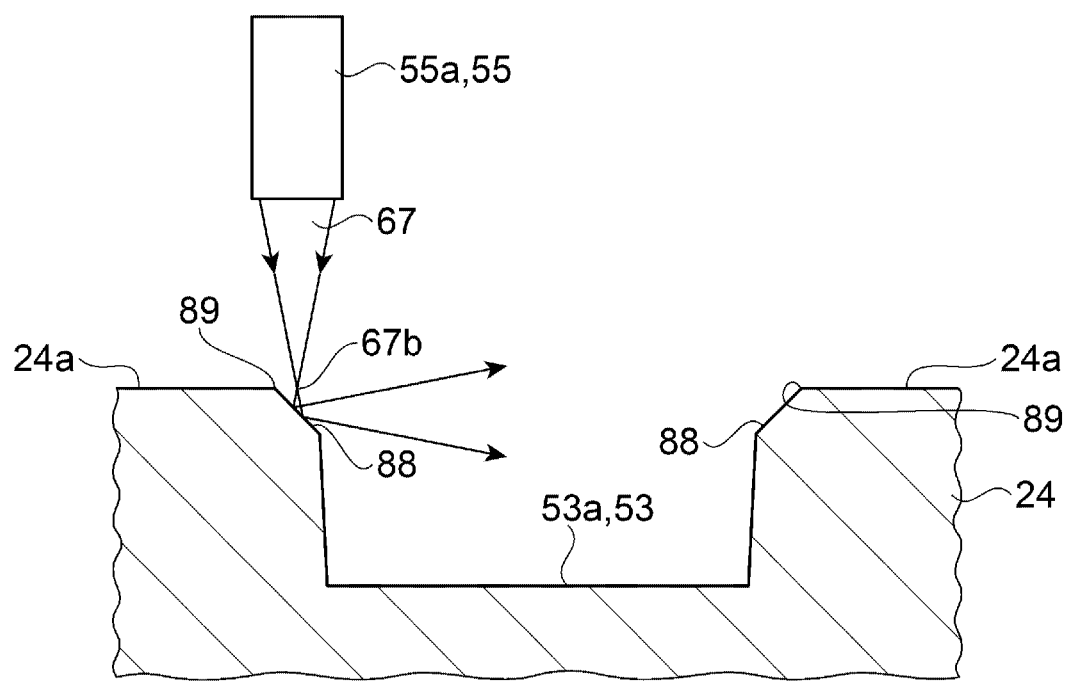
FIG. 10 is a schematic sectional side view for explanation of the method of detecting the pocket.

At step S3, the operation control unit 81 moves the focus point 67b from the upper surface 24a through the inclined surface 88 to a bottom surface 53a of the pocket 53. As shown in FIG. 10, the first transport robot 54 moves the first sensor 55 with the focus point 67b maintained in the position in the Z directions. The marker portion 87 has the inclined surface 88 around the pocket 53. The focused light 67 radiates the inclined surface 88. The light 67 is reflected by the inclined surface 88 and changes the traveling direction. The reflected light 67 does not travel toward the light focusing portion 55a, and the amount of the light 67 radiating the light focusing portion 55a is smaller.

As shown in FIG. 11, the amount of reflected light on the upper surface 24a is larger. The amount of reflected light is reduced on the mark line 89 and the amount of reflected light is smaller on the inclined surface 88. The bottom surface 53a is apart from the focus point 67b, and thus, the amount of reflected light received by the phototransistor 55f is smaller on the bottom surface 53a. The bottom surface 53a faces the light focusing portion 55a. Accordingly, in the amount of light received by the light receiving portion 68, the amount of reflected light on the bottom surface 53a is larger than the amount of reflected light on the inclined surface 88.

At step S4, the pocket measuring unit 82 detects the amount of reflected light as the amount of the light 67 reflected by the tray 24 and sets a position where the amount of reflected light changes by the determination value 85 or more as a first position. The first position is one point on the mark line 89. The position where the amount changes by the determination value 85 or more is a position where an absolute value of a difference between an amount of reflected light at a first time and an amount of reflected light at a second time detected after the first time changes by the determination value 85 or more. The amount of reflected light at the first time is the amount of reflected light on the upper surface 24a. The amount of reflected light at the second time is the amount of reflected light on the inclined surface 88. The position where the absolute value of the difference between the amounts of reflected light changes by the determination value 85 or more is a position where the amount of reflected light is reduced to less than the determination value 86. The position is a position on the mark line 89.

In FIG. 12, a line in which the focus point 67b moves along the first axis 51 is referred to as "first movement line 91". The first movement line 91 is a line crossing the pocket 53. At steps S1 to S5, the focus point 67b moves from the negative side in the X direction toward the positive side in the X direction. A position where the amount of reflected light changes by the determination value 85 or more is referred to as "first position 92". The pocket measuring unit 82 acquires a coordinate of the first position 92.

The process moves from step S6 to step S3. At step S3 to step S5, the focus point 67b moves from the positive side in the X direction toward the negative side in the X direction. A position where the amount of reflected light changes by the determination value 85 or more is referred to as "second position 93". The pocket measuring unit 82 acquires a coordinate of the second position 93. The second position 93 is a position where the amount of reflected light changes by the determination value 85 or more and different from the first position 92. The two coordinates are acquired, and then, the process moves to step S7.

At step S7, the pocket measuring unit 82 calculates a coordinate of a first middle position 94 as the middle position between the first position 92 and the second position 93. The positive side in the X direction is referred to as "first direction 95". In other words, the pocket measuring unit 82 detects the first middle position 94 as the middle position between the first position 92 and the second position 93 in the first direction 95. A direction orthogonal to the first direction 95 is referred to as "second direction 96". The second direction 96 corresponds to the Y direction. A line passing through the first middle position 94 and extending in the second direction 96 is referred to as "second movement line 97". Then, the process moves to step S8.

At step S8 to step S11, the focus point 67b moves from a negative side in the second direction 96 toward a positive side in the second direction 96. A position where the amount of reflected light changes by the determination value 85 or more is referred to as "third position 98" as the first position. The pocket measuring unit 82 acquires a coordinate of the third position 98. Then, the process moves from step S11 to step S8.

At step S8 to step S11, the focus point 67b moves from the positive side in the second direction 96 toward the negative side in the second direction 96. A position where the amount of reflected light changes by the determination value 85 or more is referred to as "fourth position 99" as the second position. The pocket measuring unit 82 acquires a coordinate of the fourth position 99. The two coordinates are acquired, and then, the process moves to step S12.

At step S12, the pocket measuring unit 82 calculates a coordinate of a second middle position 101 as a middle point between the third position 98 and the fourth position 99. In other words, the pocket measuring unit 82 detects the second middle position 101 as the middle position between the third position 98 and the fourth position 99 in the second direction 96 passing through the first middle position 94 and orthogonal to the first direction 95. The second middle position 101 is a position at the center of the pocket 53. The pocket measuring unit 82 detects the second middle position 101 as a pocket position. The pocket measuring unit 82 detects the pocket position based on the first position 92, the second position 93, the third position 98, and the fourth position 99.

According to the configuration, the spot diameter 67a of the light 67 can be adjusted by the light focusing portion 55a and the spot diameter 67a is changed according to the surface condition of the tray 24, and thereby, resolution in the planar direction may be improved. Therefore, the electronic component handler 2 that may accurately measure the position of the pocket 53 in the planar direction in which the IC device 13 is placed may be provided.

According to the configuration, the end of the light focusing portion 55a at the pocket 53 side is supported by the supporting member 62 in the Z directions. The end of the light focusing portion 55a at the pocket 53 side is likely to contact with the operator. When the position of the light focusing portion 55a changes due to the contact with the operator, the detected position of the pocket 53 changes. A part near a location with which the operator is likely to contact is supported by the supporting member 62, and thus, the change of the position of the light focusing portion 55a may be suppressed.

According to the configuration, the light focusing portion 55a is placed between the first holding hands 61c and the second holding hands 61d. The first holding hands 61c and the second holding hands 61d are moved to locations facing the pockets 53, and thus, the light focusing portion 55a may be moved to the location facing the pocket 53.

According to the configuration, the marker portion 87 is placed around the pocket 53. The marker portion 87 is the combination of the upper surface 24a orthogonal to the optical axis of the light 67 output from the light focusing portion 55a and the inclined surface 88 inclined relative to the upper surface 24a. The traveling direction of the light 67 reflected by the inclined surface 88 is different from that toward the light focusing portion 55*a*. The amounts of reflected lights radiating the light focusing portion 55*a* are different between the upper surface 24*a* and the inclined surface 88. The amount of reflected light changes at the boundary between the upper surface 24*a* and the inclined surface 88, and thus, the boundary between the upper surface 24*a* and the inclined surface 88 may be detected.

According to the configuration, the electronic component tester 1 includes the above described electronic component handler 2. The above described electronic component handler 2 may adjust the spot diameter 67*a* and detect the position of the pocket 53 with higher resolution. Therefore, the electronic component tester 1 may include the electronic component handler 2 that may detect the position of the pocket 53 with higher resolution.

According to the method, the first sensor 55 is moved toward the position of the pocket 53, and thereby, the location irradiated with the focused light 67 moves from the outside of the pocket 53 of the tray 24 toward the pocket 53. The amount of reflected light reflected from a part of the upper surface 24*a* not in the position of the pocket 53 toward the light focusing portion 55*a* is larger than the amount of reflected light reflected by the inclined surface 88 detected as the position of the pocket 53 toward the light focusing portion 55*a*. The positions where the amounts of reflected light change by the determination value 85 or more are the first position 92 to the fourth position 99. The first position 92 to the fourth position 99 show the position of the pocket 53, and thereby, the position of the pocket 53 is detected. The position of the pocket 53 is detected using the focused light 67, and thus, the position of the pocket 53 may be detected with higher resolution.

According to the method, the amount of reflected light at the first time is the amount of reflected light on the upper surface 24*a* outside of the pocket 53 and the amount of reflected light at the second time is the amount of reflected light on the inclined surface 88 of the pocket 53. The position of the pocket 53 is detected by the comparison of the change of the absolute value of the difference between the amount of reflected light on the upper surface 24*a* outside of the pocket 53 and the amount of reflected light on the inclined surface 88 of the pocket 53 with the determination value 85, and thereby, the position of the pocket 53 may be reliably detected.

According to the method, the plurality of the positions of the pocket 53 on the mark line 89 are detected, and thereby, the position of the pocket 53 may be accurately detected. Particularly, when the marker portion 87 is placed in a shape surrounding the pocket 53, the shape of the pocket 53 may be accurately known and the position of the pocket 53 may be accurately detected.

According to the method, the planar shape of the pocket 53 is the square shape. The first middle position 94 as the middle position between the first position 92 and the second position 93 on the mark line 89 of the pocket 53 in the first direction 95 is detected. The first direction 95 and the second direction 96 are orthogonal to each other. Further, the second middle position 101 as the middle position between the third position 98 and the fourth position 99 on the mark line 89 of the pocket 53 in the second direction 96 passing through the first middle position 94 is detected. The second middle position 101 is the center and the center of gravity of the square. Therefore, the method of detecting the position of the pocket may detect the center and the center of gravity of the pocket 53.

Second Embodiment

Figure 13:
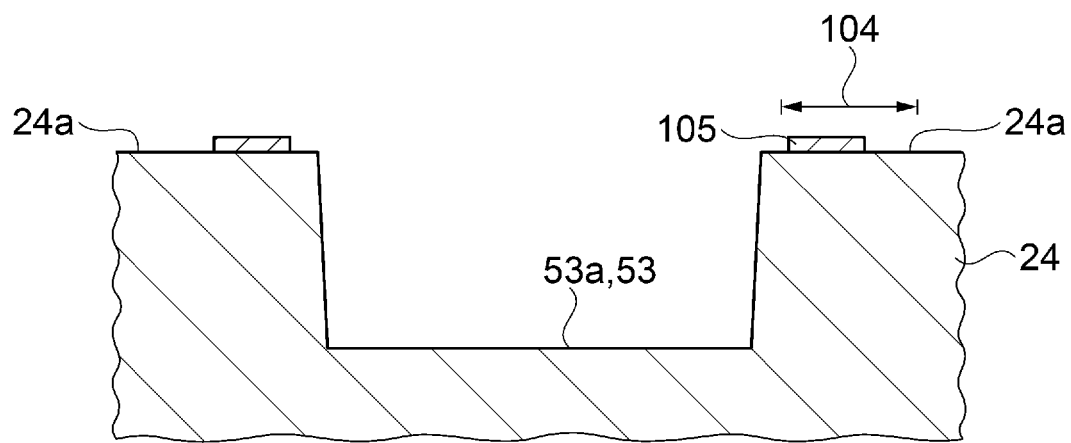
FIG. 13 is a schematic sectional side view for explanation of a marker portion according to a second embodiment.

This embodiment is different from the first embodiment in the form of the marker portion 87. As shown in FIG. 13, a first marker portion 104 as the marker portion is placed along the outer periphery of the pocket 53. The first marker portion 104 includes a mark 105 having a square frame shape and a part of the upper surface 24*a* adjacent to the mark 105. The first marker portion 104 has a combination including parts with different reflectances or colors. The first marker portion 104 surrounds the pocket 53. The first marker portion 104 is placed around the pocket 53 with a fixed width, and the planar shape of the pocket 53 and the planar shape of the first marker portion 104 are similar figures. The center of the pocket 53 and the center of the first marker portion 104 having the square planar shapes are at the same point.

The mark 105 may be formed by printing of paint. Or, the mark 105 may be formed by black chromate treatment, black nickel plating, or black chromium plating.

The first marker portion 104 is a figure including parts in different colors. The amounts of reflected light radiating the light focusing portion 55*a* are different in the locations in different colors. The amount of reflected light changes at the boundary between the upper surface 24*a* and the mark 105, and thereby, the boundary between the locations in different colors may be detected.

The upper surface 24*a* and the mark 105 have different reflectances. The amounts of reflected light radiating the light focusing portion 55*a* are different in the parts having different reflectances. The amount of reflected light changes at the boundaries between the respective parts having different reflectances, and thereby, the boundaries between the parts having different reflectances may be detected.

Figure 14:
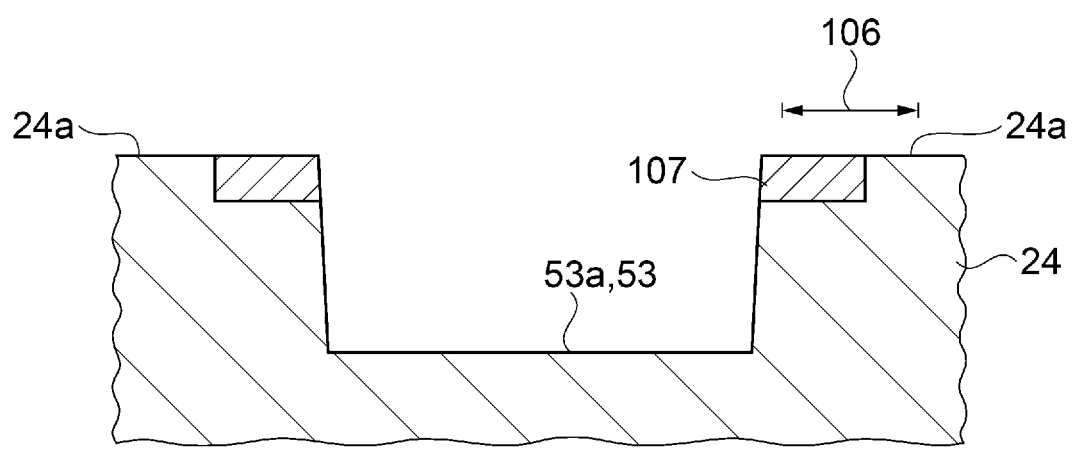
FIG. 14 is a schematic sectional side view for explanation of the marker portion.

In an example shown in FIG. 14, a second marker portion 106 as the marker portion is placed along the outer periphery of the pocket 53. The second marker portion 106 includes a square frame 107 and a part of the upper surface 24*a* adjacent to the frame 107. The frame 107 is formed using a different material from that of the tray 24. Further, the second marker portion 106 has a combination including parts having different reflectances.

The tray 24 and the frame 107 may be formed using different metals. The tray 24 and the frame 107 may be formed using resins in different colors.

The second marker portion 106 is a figure including parts of different materials. The amounts of reflected light radiating the light focusing portion 55*a* are different in the parts of different materials. The amount of reflected light changes at the boundary between the parts of different materials, and the boundaries of the parts of different materials may be detected. Therefore, the shape of the second marker portion 106 may be detected.

Third Embodiment

In the first embodiment, the focus point 67*b* moves from the upper surface 24*a* through the inclined surface 88 toward the bottom surface 53*a* of the pocket 53. The focus point 67*b* may move from the bottom surface 53*a* of the pocket 53 through the inclined surface 88 toward the upper surface 24*a*. In the procedure, the amount of reflected light at the first time is the amount of reflected light in the position of the bottom surface 53*a* of the pocket 53, and the amount of reflected light at the second time is the amount of reflected light on the upper surface 24*a* outside of the pocket 53.

According to the method, the position of the pocket 53 is detected by the comparison of the change of the absolute value of the difference between the amount of reflected light on the upper surface 24a outside of the pocket 53 and the amount of reflected light in the position of the bottom surface 53a of the pocket 53 with the determination value 85, and thereby, the position of the pocket 53 may be reliably detected.

Fourth Embodiment

The first embodiment has the structure in which the spot diameter 67a is adjusted by replacement of the light focusing portion 55a from the first case 63. Or, a structure having a changeable aperture diameter of the diaphragm portion 69 may be employed. Or, a structure having an adjustable distance between the light emitting portion 66 and the focusing lens 71 may be employed. The spot diameter 67a may be adjusted in these structures.

Fifth Embodiment

In the first embodiment, the LED 55e and the phototransistor 55f are housed in the sensor controller 55d. The LED 55e and the phototransistor 55f may be housed in the first case 63.

Sixth Embodiment

In the first embodiment, the marker portion 87 has the square shape. The shape of the marker portion 87 may be a circular shape, an oval shape, or a polygonal shape. When the shape of the marker portion 87 is not a longitudinally and laterally symmetrical shape, the center of gravity of the marker portion 87 may be used as the position of the pocket 53.

Seventh Embodiment

In the first embodiment, the first sensor 55 detects the position of the pocket 53 of the tray 24. Or, the first sensor 55 may detect the pocket 53 of the temperature adjustment unit 21. When the device feed unit 22 includes the pocket 53, the first sensor 55 may detect the pocket 53 of the device feed unit 22.

What is claimed is:

1. An electronic component handler comprising:
an electronic component mount unit having a pocket in which an electronic component is placed; and
a transport section that holds and transports the electronic component to the pocket, wherein
the transport section includes
a light emitting portion that emits a light to the pocket,
a light focusing portion that adjusts a spot diameter of the light emitted by the light emitting portion, and
a light receiving portion that receives the light reflected by the pocket,
wherein the light emitting portion, the light focusing portion, and the light receiving portion are housed in a single case.

2. The electronic component handler according to claim 1, wherein
the light focusing portion is provided between the light emitting portion and the pocket and has an end at the pocket side supported by a light focusing portion supporting part.

3. An electronic component tester comprising:
a test unit that tests the electronic component; and
the electronic component handler according to claim 1.

4. An electronic component handler comprising:
an electronic component mount unit having a pocket in which an electronic component is placed; and
a transport section that holds and transports the electronic component to the pocket, wherein
the transport section includes
a light emitting portion that emits a light to the pocket,
a light focusing portion that adjusts a spot diameter of the light emitted by the light emitting portion, and
a light receiving portion that receives the light reflected by the pocket,
wherein the transport section includes a first holding unit and a second holding unit that detachably hold the electronic component, and the light focusing portion is placed between the first holding unit and the second holding unit.

5. The electronic component handler according to claim 4, wherein
the light focusing portion is provided between the light emitting portion and the pocket and has an end at the pocket side supported by a light focusing portion supporting part.

6. An electronic component tester comprising:
a test unit that tests the electronic component; and
the electronic component handler according to claim 4.

7. An electronic component handler comprising:
an electronic component mount unit having a pocket in which an electronic component is placed; and
a transport section that holds and transports the electronic component to the pocket, wherein
the transport section includes
a light emitting portion that emits a light to the pocket,
a light focusing portion that adjusts a spot diameter of the light emitted by the light emitting portion, and
a light receiving portion that receives the light reflected by the pocket,
wherein the electronic component mount unit has a marker portion around the pocket, and
the marker portion has a combination of a first surface orthogonal to an optical axis of the light output from the light focusing portion and a second surface inclined relative to the first surface or a combination of parts having different reflectances.

8. The electronic component handler according to claim 7, wherein
the light focusing portion is provided between the light emitting portion and the pocket and has an end at the pocket side supported by a light focusing portion supporting part.

9. An electronic component tester comprising:
a test unit that tests the electronic component; and
the electronic component handler according to claim 7.

* * * * *